United States Patent
Eguchi et al.

(10) Patent No.: US 7,649,782 B2
(45) Date of Patent: Jan. 19, 2010

(54) NON-VOLATILE MEMORY HAVING A DYNAMICALLY ADJUSTABLE SOFT PROGRAM VERIFY VOLTAGE LEVEL AND METHOD THEREFOR

(75) Inventors: Richard K. Eguchi, Austin, TX (US); Jon S. Choy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 199 days.

(21) Appl. No.: 11/831,168

(22) Filed: Jul. 31, 2007

(65) Prior Publication Data

US 2009/0034339 A1  Feb. 5, 2009

(51) Int. Cl.
*G11C 16/06* (2006.01)

(52) U.S. Cl. .......................... 365/185.22; 365/185.09

(58) Field of Classification Search ............ 365/185.22, 365/185.2, 185.09, 185.11, 185.18
See application file for complete search history.

(56) References Cited

U.S. PATENT DOCUMENTS

| | | | |
|---|---|---|---|
| 5,521,867 A | 5/1996 | Chen et al. | |
| 5,963,477 A | 10/1999 | Hung | |
| 6,496,417 B1 * | 12/2002 | Shiau et al. | 365/185.2 |
| 6,654,292 B2 | 11/2003 | Keays | |
| 6,684,173 B2 * | 1/2004 | Kessenich et al. | 702/117 |
| 7,073,103 B2 * | 7/2006 | Gongwer et al. | 714/718 |
| 7,230,854 B2 * | 6/2007 | Wan et al. | 365/185.22 |

OTHER PUBLICATIONS

U.S. Appl. No. 11/364,129, filed Feb. 28, 2006.
International Search Report and Written Opinion for correlating PCT Patent Application No. PCT/US2008/067222 dated Sep. 25, 2008.

* cited by examiner

*Primary Examiner*—Gene N. Auduong
(74) *Attorney, Agent, or Firm*—Joanna G. Chiu

(57) ABSTRACT

An erase operation in a non-volatile memory includes selecting a block on which to perform an erase operation, erasing the selected block, receiving test data corresponding to the selected block, determining a soft program verify voltage level based on the test data, and soft programming the erased selected block using the soft program verify voltage level. A non-volatile memory includes a plurality of blocks, a test block which stores test data corresponding to each of the plurality of blocks, and a flash control coupled to the plurality of blocks and the test block, the flash control determining a soft program verify voltage level for a particular block of the plurality of blocks based on the test data for the particular block when the particular block is being soft programmed.

20 Claims, 4 Drawing Sheets

US 7,649,782 B2

NON-VOLATILE MEMORY HAVING A DYNAMICALLY ADJUSTABLE SOFT PROGRAM VERIFY VOLTAGE LEVEL AND METHOD THEREFOR

BACKGROUND

1. Field

This disclosure relates generally to memories, and more specifically, to non-volatile memories having a dynamically adjustable soft program verify voltage level.

2. Related Art

A flash memory cell is a type of non-volatile memory (NVM) cell that stores charge on a floating gate. The amount of charge on the floating gate determines a threshold voltage (Vt) of the cell, hence the logic state stored by the cell. Each time the cell is programmed or erased, electrons are moved to or from the floating gate. The floating gate is electrically isolated so that charge is stored indefinitely. However, as geometries continue to scale down, the gm degradation (where gm=$\Delta$Ids/$\Delta$Vgs) of a flash bitcell with increasing program and erase cycling becomes more significant causing a need to better manage column leakage throughout the lifetime of the part. To address this gm degradation, soft program has been introduced to tighten the Vt distribution of erased cells. However, this soft programming increases erase times for the flash memory thus resulting in decreased system performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As discussed above, as the geometries of flash memories continue to scale, gm degradation with increasing program and erase cycling becomes more significant, resulting in increased erase times. Furthermore, this gm degradation is a worse problem for flash memories used for data storage applications which typically require a high number of cycles as compared to flash memories used for code storage which typically require a lower number of cycles. For example, for data storage applications, as many as 100,000 cycles may need to be performed during the lifetime of the flash memory where for code storage, only a 1000 cycles may be needed over the lifetime of the flash memory. Therefore, a tighter Vt distribution needs to be achieved during soft programming for those bitcells which require a higher number of cycles as compared to those requiring a lower number of cycles. One embodiment of the present invention introduces a dynamically adjustable soft program verify voltage level as a function of the number of cycles to be performed. That is, through the use of an adjustable soft program verify voltage level, erase times for those flash memory blocks which require a low number of cycles may be improved by using a lower soft program verify voltage level since a less tight Vt distribution of erase cells is needed. However, for those flash memory blocks which require a high number of cycles, a higher soft program verify voltage level which ensures a tighter Vt distribution of erase cells may be used to adequately remove the excessive column leakage resulting from the higher number of cycles.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Figure 1:
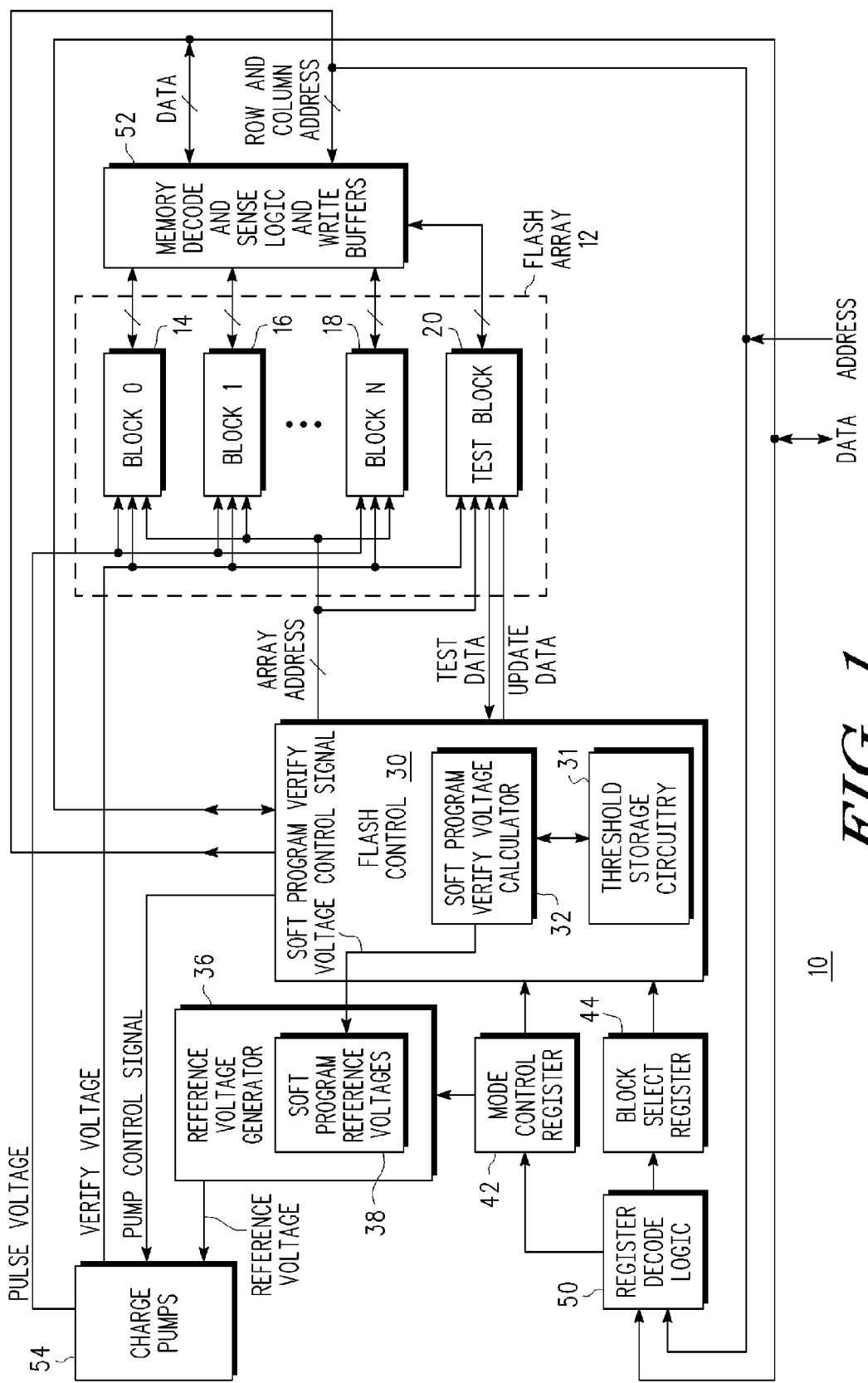
FIG. 1 illustrates, in block diagram form, a flash memory in accordance with an embodiment of the present invention.

FIG. 1 illustrates, in block diagram form, a flash memory 10 in accordance with an embodiment of the present invention. In FIG. 1, for the purposes of clarity and simplicity, only the circuits helpful for describing embodiments of the current invention are illustrated. Flash memory 10 includes an array of flash memory cells 12, a flash control 30, registers 42 and 44, register decode logic 50, memory decode and sense logic and write buffers 52, charge pumps 54, and reference voltage generator 36. The array of flash memory cells 12 includes memory blocks 14, 16, 18, and a test block 20. Flash control 30 includes soft program verify voltage calculator 32 and threshold storage circuitry 31, coupled to each other. Reference voltage generator 36 includes soft program reference voltages 38.

Each of blocks 14, 16, 18, and 20 includes a plurality of flash memory cells. The flash memory cells are arranged in a matrix having word lines and bit lines. A memory cell is connected at the intersections of the word lines and the bit lines, and includes a control gate connected to the word line, a drain terminal connected to the bit line, and a source terminal connected to the source terminals of all the other memory cells within a block. The memory cell has a charge storage region. The charge storage region is electrically isolated and is known as a floating gate in some embodiments. The charge storage region may be made from polysilicon, or may comprise other charge storage materials, such as for example, nanocrystals or nitride. In the illustrated embodiment, memory 10 is embedded on an integrated circuit with other circuit components such as for example, a microprocessor core. In other embodiments, memory 10 may be implemented as a "stand-alone" memory integrated circuit.

Memory 10 has a plurality of input terminals for receiving a plurality of address signals labeled "ADDRESS". These address signals include, for example, row address signals, column address signals, and block select signals. The memory decode and sense logic and write buffers 52 has a plurality of input terminals for receiving the row and column address signals during read and program operations of memory 10. The memory decode and sense logic and write buffers 52 is also coupled to flash control 30 for receiving row and column address signals during erase operations. Generally, the memory decode and sense logic and write buffers 52 includes input and output circuitry such as sense amplifiers, row and column decoders, write buffers for holding data to be written to the blocks of flash array 12, and the like. Data signals, labeled "DATA" are transmitted by or to each of the memory decode and sense logic and write buffers 52, flash control 30, and register decode logic 50. A processor (not shown) may be coupled to provide and/or receive the data signals DATA and to provide the address signals ADDRESS. The processor may be implemented on the same integrated circuit as memory 10 or may be on a separate integrated circuit.

Memory blocks 14, 16, and 18 are bi-directionally coupled between memory decode and sense logic and write buffers 52 for sending and receiving data in response to receiving row and column address information. In the illustrated embodiment, read and program operations of the flash memory 10 are conventional and will not be described in detail. Also, note that not all of the circuitry necessary for reading and programming memory 10 is illustrated in FIG. 1 for the purpose of simplicity and clarity. During a normal access for either a read operation or a program operation, memory blocks 14, 16, and 18 receive address information to select memory cells within one or more of the blocks 14, 16, and 18. Data is provided by the selected memory cells during a read operation and received by the selected memory cells during a write operation.

In one embodiment, the array addresses select a memory location within flash array 12 on which to operate where block select register 44 indicates to flash control 30 the current block based on the address signals ADDRESS. Register decode logic 50 receives address signals ADDRESS and data signals DATA and provides the appropriate information to be stored in block select register 44 and in mode control register 42. Mode control register 42 indicates a current mode of flash memory 10 to reference voltage generator 36 and flash control 30 where the current mode may indicate, for example, a program, an erase, a soft program, etc.

Erase operations are controlled by circuitry within flash control 30. Flash control 30 has an output for providing array addresses to the blocks 14, 16, and 18 and test block 20, an output for providing a charge pump control signal to charge pumps 54, and an output for providing a soft program verify voltage control signal. In the embodiment of FIG. 1, flash control 30 includes a soft program verify voltage calculator 32 which outputs the soft program verify voltage control signal. Flash control 30 also includes threshold storage circuitry 31 which stores one or more predetermined thresholds used by soft program verify voltage calculator 32 to provide the soft program verify voltage control signal. Charge pumps 54 are used to generate voltages (including a pulse voltage and a verify voltage) for program operations, erase operations, or both program and erase operations. The pump control signal indicates which of charge pumps 54 is to be enabled, where flash control 30 may provide the pump control signal based on, for example, the mode indicated by mode control register 42. Also, the voltages that are generated by charge pumps 54 are generated based on a received reference voltage which is provided by voltage reference generator 36. Reference voltage generator 36 includes soft program reference voltages 38 such that, during a soft program, one of these soft program reference voltages 38 can be selected by the soft program verify voltage control signal and provided as the reference voltage to charge pumps 54. Similarly, during other operations, as indicated by mode control register 42, reference voltage generator 36 generates the appropriate reference voltage to be provided to charge pumps 54.

Test block 20 functions essentially the same as the memory blocks 14, 16, and 18 except that test block 20 is hidden and is not accessible by a user. Test data is provided from test block 20 to flash control 30 and update data is provided from flash control 30 to test block 20. Test block 20 may be used for storing testing information, lot numbers, identification numbers, redundancy mapping, trim options, and other information useful for a manufacturer of memory 10. In addition, block 20 may include locations for storing other information, examples of which are provided in FIGS. 2 and 3.

Figure 2:
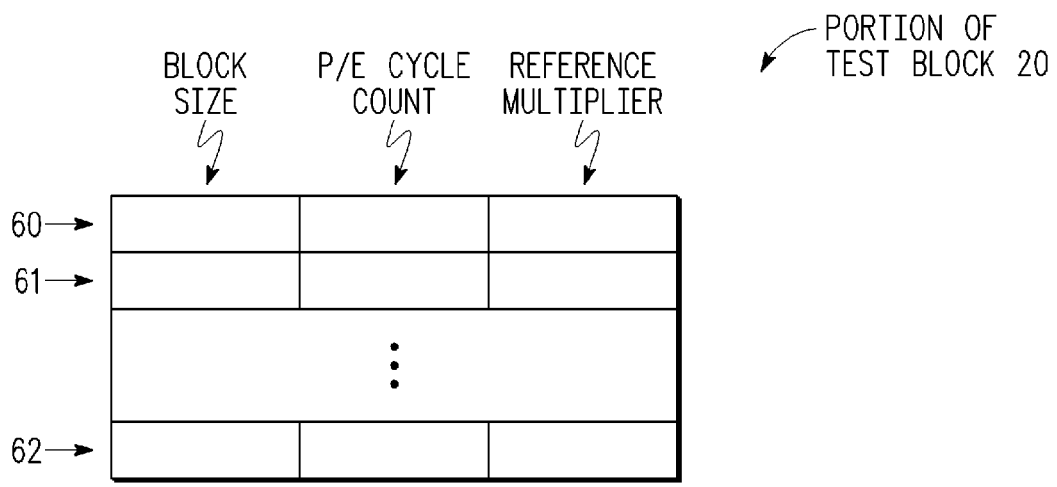
FIG. 2 illustrates, in block diagram form, a portion of a test block of the flash memory of FIG. 1 in accordance with an embodiment of the present invention.

FIG. 2 illustrates a portion of test block 20 in accordance with one embodiment, where test block 20 includes a number of storage locations 60-62 for storing test information for each block of flash array 12. Therefore, if there are N+1 blocks, as illustrated in FIG. 1, the portion of test block 20 illustrated in FIG. 2 may include N+1 locations. Each location in FIG. 2 indicates a block size, a program/erase (P/E) count, and a reference multiplier for its corresponding block of flash array 12. For example, the block size, P/E cycle count, and reference multiplier stored in location 60 may all correspond to block 14 of flash array 12, and the block size, P/E cycle count, and reference multiplier stored in location 61 may all correspond to block 16 of flash array 12.

Figure 3:
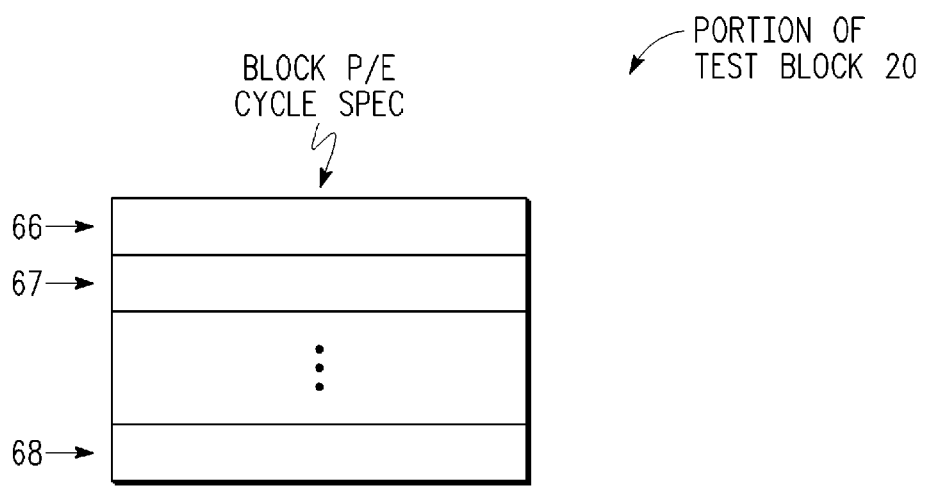
FIG. 3 illustrates, in block diagram form, a portion of a test block of the flash memory of FIG. 1 in accordance with an embodiment of the present invention.

FIG. 3 illustrates a portion of test block 20 in accordance with another embodiment, where test block 20 includes a number of storage locations 66-68 for storing test information for each block of flash array 12. Therefore, if there are N+1 blocks, as illustrated in FIG. 1, the portion of test block 20 illustrated in FIG. 3 may include N+1 locations. Each location in FIG. 2 indicates the block P/E cycle spec for the corresponding block of flash array 12. That is, in one embodiment, the block P/E cycle spec may indicate a number of expected cycles, or a level of expected cycles. For example, in one embodiment, the P/E cycle spec may indicate whether a high number of P/E cycles are expected (such as for blocks which store data) or whether a low number of P/E cycles are expected (such as for blocks which store code).

Figure 4:
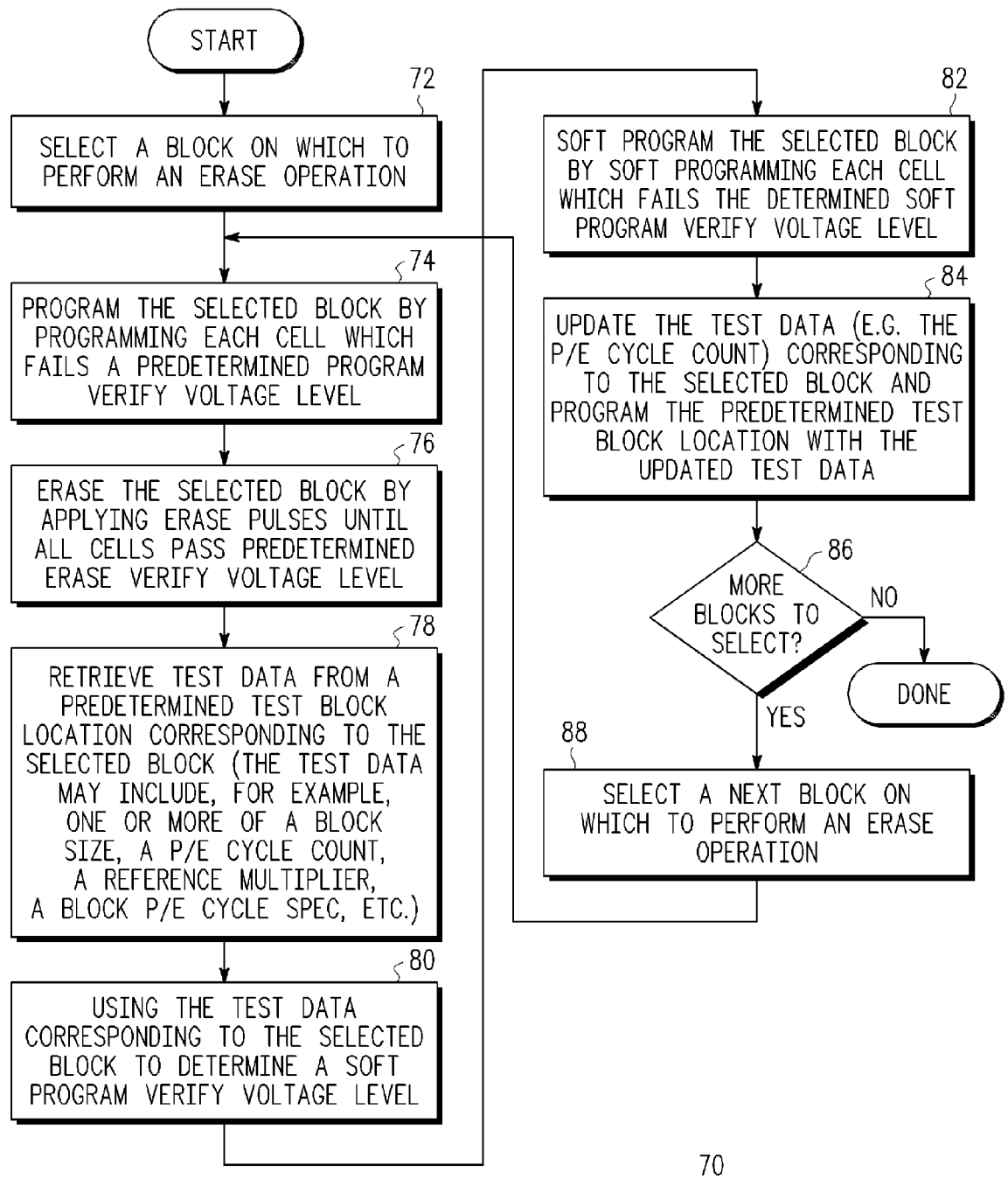
FIG. 4 illustrates, in flow diagram form, a method for performing an erase operation on the flash memory of FIG. 1 in accordance with an embodiment of the present invention.

FIG. 4 illustrates an example of an erase operation performed on flash memory 10. Flow 70 begins with block 72 in which a block is selected from array 12 on which to perform an erase operation. An identification of this selected block can be stored for example, in block select register 44 of FIG. 1. Flow then proceeds to block 74 where the selected block is programmed by programming each cell which fails a predetermined program verify voltage level. For example, each cell of the selected block can be accessed by flash control 30 by generating the appropriate array addresses. Each cell that fails the program verify voltage level can be gradually programmed in steps using a program pulse of relative short duration. The voltage for these program pulses may be provided by charge pumps 54 as the pulse voltage. In one embodiment, mode control register 42 is programmed by way of address signals ADDRESS and data signals DATA to indicate that a program is being performed. In this manner, reference voltage generator 36, using this information within mode control register 42, can provide the appropriate value for the reference voltage to charge pumps 54 such that the program pulse voltage can be generated. After the application of each program pulse, a verification step may be used to check the Vt to determine if the Vt has been sufficiently increased. The program verify voltage for the verification step may be provided by charge pumps 54 as the verify voltage to array 12, where, as for the pulse voltage, reference voltage generator 36 provides the appropriate reference voltage to charge pumps 54 so that the appropriate program verify voltage can be provided for the verification step. The program and verify steps are repeated until all of the cells in the selected block pass the program verify voltage level (i.e. until none of the cells indicate an erased response to the verification step).

Figure 5:
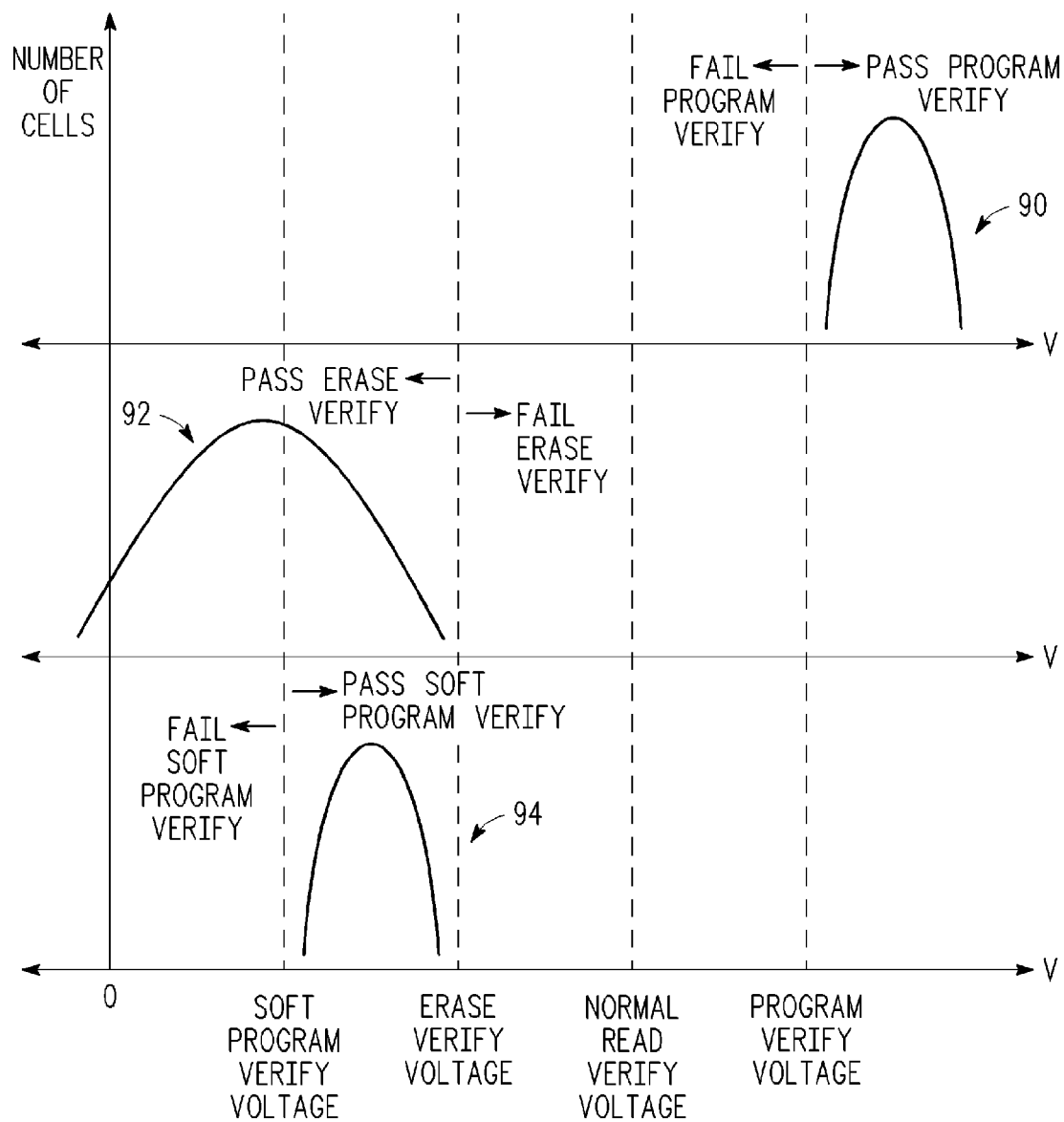
FIG. 5 illustrates, in graph form, various Vt distributions during operation of the flash memory of FIG. 1 in accordance with an embodiment of the present invention.

FIG. 5 illustrates the Vt distributions of flash cells within a block after programming (distribution 90), erasing (distribution 92), and soft programming (distribution 94). Therefore, referring to distribution 90, note that each of the cells in the selected block are programmed until all of the cells in the selected block pass (e.g. are higher than) the program verify voltage level. If any of the cells in distribution 90 are located to the left of the program verify voltage level, they may be read as not programmed rather than programmed. Note that in the illustrated embodiment, a programmed cell refers to a stored logic level zero while an erased cell refers to a stored logic level one. However, alternatively, a programmed cell may refer to a stored logic level one while an erased cell may refer to a stored logic level zero.

Referring back to FIG. 4, after programming the selected block by programming each cell, flow proceeds to block 76 where the selected block is erased by applying erase pulses until all cells pass a predetermined erase verify voltage level. Each cell that fails the erase verify voltage level can be gradually erased in steps using an erase pulse of relative short duration. The voltage for these erase pulses may be provided by charge pumps 54 as the pulse voltage. In one embodiment, mode control register 42 is programmed by way of address signals ADDRESS and data signals DATA to indicate that an erase is being performed. In this manner, reference voltage generator 36, using this information within mode control register 42, can provide the appropriate value for the reference voltage to charge pumps 54 such that the erase pulse voltage can be generated. After the application of each erase pulse, a verification step may be used to check the Vt to determine if the Vt has been sufficiently reduced. The erase verify voltage for the verification step may be provided by charge pumps 54 as the verify voltage to array 12, where, as for the pulse voltage, reference voltage generator 36 provides the appropriate reference voltage to charge pumps 54 so that the appropriate erase verify voltage can be provided for the verification step. The erase and verify steps are repeated until none of the cells indicate a not erased response to the verification step.

Therefore, referring to distribution 92 of FIG. 5, note that each of the cells in the selected block are erased until all of the cells in the selected block pass (e.g. are lower than) the erase verify voltage level. If any of the cells in distribution 92 are located to the right of the erase verify voltage level, they may be read as not erased rather than erased. Therefore, at this point, note that all of the cells are erased. However, in order to remove excessive column leakage, the erased Vt distribution is compacted by performing a soft program. A soft program of a cell, if needed, is performed at a lower gate voltage than a program of the cell. In one example, a cell is programmed by placing one current electrode at 0 volts, the other at 5 volts, and the control electrode at 9 volts, where the cell is soft programmed by placing one current electrode at 0 volts, the other at 5 volts, and the control electrode at 3 volts. In this manner, the resulting distribution, such as distribution 94 of FIG. 5, is more compact than distribution 92 (and farther away from Vt=0 volts), where, after soft programming a selected block, all the cells in the block have a Vt that is greater than a soft program verify voltage level but still less than the erase verify voltage level. (Soft programming will be discussed in more detail in reference to blocks 78, 80, 82, and 84 below.) Therefore, note that in the illustrated embodiment, the erase verify voltage is less than the program verify voltage, and the soft program verify voltage is less than the erase verify voltage, where the normal read verify voltage is located between the erase verify voltage and the program verify voltage.

The tightness of the Vt distribution that needs to be achieved for a particular block depends on factors such as, for example, the number of program/erase (P/E) cycles performed over the lifetime of that particular block, the block size, etc. For example, if a large number of cycles will likely be performed, a tighter Vt distribution may be needed, where a higher soft program verify voltage level can be used to achieve this tighter Vt distribution. However, if a small number of cycles will likely be performed, then a less tight Vt distribution may be acceptable. In this case, a lower soft program verify level may be sufficient. In those blocks where a lower soft program verify level may be used, less pulses are required to perform the soft program. In this manner, by using a lower soft program verify voltage level when possible, overall erase performance can be improved.

Therefore, referring back to the flow of FIG. 4, after erasing the selected block in block 76, flow proceeds to block 78 where test data is retrieved from a predetermined test block location which corresponds to the selected block. This test data can be received by flash control 30, for example, via test signals TEST DATA from test block 20. Alternatively, this test data can be received by flash control 30 via memory decoder and sense logic and write buffers 52 and data signals DATA. The test data may include, for example, one or more of the following: a block size, a P/E cycle count, a reference multiplier, a block P/E cycle spec, etc. In the example of FIG. 2, test block 20 includes one storage location (such as each of locations 60-61) corresponding to each test block of array 12. In the example of FIG. 2, each storage location stores a block size, a P/E cycle count, and a reference multiplier for the corresponding block of array 12. In the example of FIG. 3, each storage location stores a block P/E cycle spec for the corresponding block of array 12. Alternate embodiments may include more or less information or different information than the examples of FIGS. 2 and 3.

After block 78, flow proceeds to block 80 where the test data corresponding to the selected block is used to determine a soft program verify voltage level for the soft programming to be performed for the selected block in block 82. In one embodiment, the soft program verify voltage level is set such that the leakage current of every column (i.e. the current at Vgs=0 volts) is below a certain value such that the sense amplifier (located in, for example, memory decode and sense logic and write buffers 52 of FIG. 1) can accurately discern between an erased bit and a programmed bit. Therefore, in one embodiment, soft program verify voltage calculator 32 uses the test data to select one of soft program reference voltages 38 by way of the soft program verify voltage control signal. The selected soft program reference voltage is then provided as the reference voltage to charge pumps 54 so that charge pumps 54 can provide the appropriate corresponding soft program verify voltage to the selected block of array 12. Therefore, in one embodiment, soft program reference voltages 38 stores two or more different soft program reference voltages which can be used to generate two or more corresponding soft program verify voltages. In this manner, by, for example, selecting the appropriate soft program reference voltage, soft program verify voltage calculator 32 determines the soft program verify voltage level to be used. Alternatively, soft program verify voltage calculator 32 or reference voltage generator 36 can directly calculate or otherwise determine the soft program reference voltage level corresponding to the desired soft program verify voltage level. In yet other embodiments, soft program verify voltage calculator 32 may use other methods to select or determine the soft program verify voltage level based on the test data. Therefore, each selected block on which the erase operation is performed can use a customized soft program verify voltage level, as determined by, e.g., soft program verify voltage calculator 32. For example, blocks within array 12 which do not need as tight as a Vt distribution can use a lower soft program verify voltage level.

For the embodiment of FIG. 2, soft program verify voltage calculator 32 uses the P/E cycle count for the selected block to determine the soft program verify voltage level, where the P/E cycle count indicates a number of P/E cycles that have already been performed on the selected block. For example, if a particular number of P/E cycles have already been performed (i.e. if the P/E cycle count exceeds a first predetermined threshold, which may be stored in threshold storage circuitry 31), then a higher soft program verify voltage level may be used. However, if the P/E cycle count has not yet reached the first predetermined threshold, then a lower soft program verify voltage can still be used. In this manner, soft program verify voltage calculator 32 can dynamically adjust the soft program verify voltage level during operation. That is, by selecting a different soft program reference voltage based on whether the P/E cycle count (or a function of the P/E cycle count) has reached the first threshold, different soft program reference voltages can be generated by charge pumps 54.

Furthermore, the block size also affects the total column leakage, since the total column leakage is the sum of all current from every bit along the column of a block. Since the number of bits increases with the block size, the column leakage also increases with block size. Therefore, in one embodiment, block size in addition to P/E cycle count is taken into account when determining a soft program verify voltage level. For example, a smaller block can handle a larger number of P/E cycles while still maintaining an adequately tight Vt distribution as compared to a larger block. In one embodiment, a function of the received P/E cycle count and the block size is compared against stored predetermined thresholds to determine a soft program verify voltage level. In alternate embodiments, a function of the received P/E cycle count, the block size, and a reference multiplier may be used to compare against predetermined thresholds to determine a soft program verify voltage level. The reference multiplier can be characterized based on the design of flash memory 10, and may be the same for each block or have a different value for different block sizes. For example, in one embodiment, soft program verify voltage calculator 32 may calculate a soft program verify value that is equal to the "P/E cycle count*block size*reference multiplier", where this soft program verify value is compared to one or more different thresholds in order to determine the soft program verify voltage level (and to provide the soft program verify voltage control signal accordingly). For example, if one predetermined threshold is used, then a first soft program verify voltage level may be determined when the soft program verify value is greater than the one predetermined threshold, and a second soft program verify voltage level may be determined when the soft program verify value is less than or equal to the one predetermined threshold.

For the embodiment of FIG. 3, soft program verify voltage calculator 32 uses the block P/E cycle spec for the selected block to determine the soft program verify voltage level. For example, the block P/E cycle spec may indicate whether the corresponding block is expected to have a high number of P/E cycles performed over its lifetime or a low number of P/E cycles, where in the former case, soft program verify voltage calculator 32 determines that a higher soft program verify voltage is to be used than in the latter case. Alternatively, the block P/E cycle spec may indicate one of any number of different levels of expected number of cycles to be performed, where each level (e.g. low, medium, or high number of P/E cycles are expected to be performed over the lifetime) corresponds to a different soft program voltage verify level. Therefore, in this embodiment, soft program verify voltage calculator 32 may calculate a soft program verify value based on the received P/E cycle spec for the selected block to compare to one or more predetermined thresholds and thus determine a soft program verify voltage level.

Therefore, note that soft program verify voltage calculator 32 may use one or more predetermined thresholds (stored, for example, in threshold storage circuitry 31) where, based on the received test data, a soft program verify value can be determined and compared to the one or more thresholds. Each of these one or more thresholds may therefore correspond to one or more different soft program verify voltage levels that can provided as the soft program verify voltage. The soft program verify value can be based on any type of test data, and can be a function of one or more parameters. For example, it can be equal to the P/E cycle count itself for the selected block or it can be a function of more than one parameter, such as a function of the P/E cycle count, block size, and reference multiplier. As another example, it can be based on the P/E cycle spec for the particular block.

Referring back to the flow of FIG. 4, flow proceeds from block 80 to block 82, where the selected block is soft programmed by soft programming each cell which fails the determined soft program verify voltage (previously determined in block 80). For example, each cell of the selected block can be accessed by flash control 30 by generating the appropriate array addresses. In one embodiment, each cell that fails the soft program verify voltage can be gradually soft programmed in steps using a soft program pulse of relative short duration. The voltage for these program pulses may be provided by charge pumps 54 as the pulse voltage. In one embodiment, mode control register 42 is programmed by way of address signals ADDRESS and data signals DATA to indicate that a program is being performed. In this manner, reference voltage generator 36, using this information within mode control register 42, can provide the appropriate value for the reference voltage to charge pumps 54 such that the soft program pulse voltage can be generated. After the application of each soft program pulse, a verification step is used to check the Vt to determine if the Vt has been sufficiently increased. The soft program verify voltage for the verification step corresponds to the soft program verify voltage level determined by soft program verify voltage calculator 32 for the selected block based on TEST DATA received for the selected block. The soft program and verify steps are repeated until all of the cells in the selected block pass the soft program verify voltage level.

Flow then proceeds to block 84 where the test data corresponding to the selected block is updated. For example, for the embodiment of FIG. 2, the P/E cycle count corresponding to the selected block is updated. That is, the P/E cycle count is incremented to reflect that another P/E cycle has just been performed for the selected block. The predetermined test block location within test block 20 is then programmed with this updated P/E cycle count. In one embodiment, this P/E cycle count is updated by flash control 30 and provided by flash control 30 to test block 20 via update signals UPDATE DATA. Alternatively, the updated P/E cycle count can be provided by flash control 30 to the write buffers of memory decode and sense logic and write buffers 52 via data signals DATA to be programmed into test block 20. In an alternate embodiment, such as for the embodiment of FIG. 3, no update of corresponding test data is necessary, therefore, block 84 may not be present in flow 70.

Flow then proceeds to decision diamond 86 where it is determined whether there are more blocks in array 12 to select. If not, flow 70 ends. If so, then a next block is selected on which to perform an erase operation and flow returns to block 74. Note that for this next block, based on the test data stored in test block 20 corresponding to this next block, a different soft program voltage verify level may be used for the soft program of block 82.

Note that the actual values used for the verify voltages and pulse voltages for the programming and erases can be selected, as known in the art, based on the design of the particular flash memory. The values of the stored thresholds used by soft program verify voltage calculator 32 may depend on the type functions and type of test data being used to determine the soft program verify values and thus may vary from one embodiment to another, and the voltage values used for the corresponding soft program verify voltage levels can be selected based on the design of the particular flash memory.

Therefore, by now it can be understood how stored test data for each block of array 12 can be used to dynamically adjust the soft program verify voltage level used during the soft programming of a selected block. That is, the soft program verify voltage level can be adjusted based on a variety of different factors for a variety of reasons. For example, different soft program verify voltage levels can be selected or determined or generated based at least in part on the block size and how many P/E cycles have been performed up to date. In another example, different soft program verify voltage levels can be selected or determined or generated based on how many P/E cycles are expected to be performed over the lifetime of the particular block (i.e. the particular P/E cycle spec for that particular block). In other examples, other types of information can be used to dynamically determined the appropriate soft program verify voltage level. Therefore, note that any number of different soft program verify voltage levels can be used, depending on the design, needs, and uses of memory 10. Through the use of an adjustable soft program verify voltage level that may be determined based on test data for a particular block, a single soft program verify voltage level which covers the worst case block for all of array 12 need not be used for every block of array 12. In this manner, some blocks within array 12 may be able to use a lower soft program verify voltage level, thus saving time during the soft programming portion of an erase operation.

In one embodiment, a method for performing an erase operation in a non-volatile memory includes selecting a block on which to perform an erase operation, erasing the selected block, receiving test data corresponding to the selected block, determining a soft program verify voltage level based on the test data, and soft programming the erased selected block using the soft program verify voltage level.

In a further embodiment, the determining the soft program verify voltage level includes selecting the soft program verify voltage level from a plurality of soft program verify voltage levels.

In another further embodiment, the determining the soft program verify voltage level includes determining a soft program reference voltage, and generating a soft program verify voltage at the soft program verify voltage level using the soft program reference voltage.

In another further embodiment, the soft programming the erased selected block includes determining that a cell of the erased selected block fails the soft program verify voltage level, applying a soft program voltage pulse to the cell, and determining whether the cell fails or passes the soft program verify voltage level. In yet a further embodiment, erasing the selected block includes applying erase pulses to each cell of the selected block until each cell passes a predetermined erase verify voltage level, wherein the soft program verify voltage level is less than the erase verify voltage level. In yet an even further embodiment, the method includes, prior to erasing the selected block, programming each cell of the selected block which fails a predetermined program verify voltage level, wherein the erase verify voltage level is less than the program verify voltage level.

In another further embodiment, the test data includes a program/erase cycle count for the selected block, and the soft program verify voltage level is determined based at least in part on the program/erase cycle count. In yet a further embodiment, the method further includes updating the program/erase cycle count for the selected block, and storing the updated program/erase cycle count. In another yet further embodiment, the test data further includes a block size for the selected block, and the soft program verify voltage level is determined based at least in part on the program/erase cycle count and the block size.

In another further embodiment, the test data indicates an expected number of program/erase cycles to be performed on the selected block, and wherein the soft program verify voltage level is determined based at least in part on the expected number of program/erase cycles to be performed on the selected block.

In another embodiment, a method for performing an erase operation in a non-volatile memory includes selecting a block on which to perform an erase operation, erasing the selected block, receiving a program/erase cycle count corresponding to the selected block, determining a soft program verify voltage level based at least in part on the program/erase cycle count, and soft programming the erased selected block using the soft program verify voltage level.

In a further embodiment of the another embodiment, the method further includes increasing the program/erase cycle count, and storing the increased program/erase cycle count. In yet a further embodiment, the method further includes performing a second erase operation on the selected block, where the performing the second erase operation on the selected block includes erasing the selected block, receiving the increased program/erase cycle count corresponding to the selected block, determining a second soft program verify voltage level based at least in part on the increased program/erase cycle count, where the second soft program verify voltage level is different from the soft program verify voltage level, and soft programming the erased selected block using the second soft program verify voltage level.

In another further embodiment of the another embodiment, the determining the soft program verify voltage level includes determining the soft program verify voltage level based at least in part on the program/erase cycle count and a block size of the selected block.

In another further embodiment of the another embodiment, the soft programming the erased selected block includes determining that a cell of the erased selected block fails the soft program verify voltage level, applying a soft program voltage pulse to the cell, and determining whether the cell fails or passes the soft program verify voltage level. In yet a further embodiment, erasing the selected block includes applying erase pulses to each cell of the selected block until each cell passes a predetermined erase verify voltage level, where the soft program verify voltage level is less than the erase verify voltage level.

In yet another embodiment, a non-volatile memory includes a plurality of blocks, a test block, where the test block stores test data corresponding to each of the plurality of blocks, and a flash control coupled to the plurality of blocks and the test block, the flash control determining a soft program verify voltage level for a particular block of the plurality of blocks based on the test data for the particular block when the particular block is being soft programmed.

In a further embodiment of the yet another embodiment, the stored tests data stores a program/erase cycle count for each of the plurality of blocks.

In another further embodiment of the yet another embodiment, the stored tests data indicates an expected number of program/erase cycles to be performed on each of the plurality of blocks.

In another further embodiment of the yet another embodiment, the non-volatile memory further includes a charge pump coupled to the plurality of blocks, the charge pump providing a soft program verify voltage to the particular block at the determined soft program verify voltage level when the particular block is being soft programmed.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different flash memory designs. For example, although FIG. 1 and the discussion thereof describe an exemplary flash memory architecture, this exemplary architecture is presented merely to provide a useful reference in discussing various aspects of the invention. Of course, the description of the architecture has been simplified for purposes of discussion, and it is just one of many different types of appropriate architectures and designs that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of memory 10 is embedded on an integrated circuit with other circuit components such as for example, a microprocessor core. In other embodiments, memory 10 may be implemented as a "stand-alone" memory integrated circuit. Also for example, memory 10 or portions thereof may be soft or code representations of physical circuitry or of logical representations convertible into physical circuitry. As such, memory 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different types of test data may be stored in test block 20, and this stored test data may also be organized in a different manner. Also, the soft program verify value may be determined using different functions of the test data, and may be compared against any number of thresholds to determine a soft program verify voltage level. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for performing an erase operation in a non-volatile memory, comprising:
   selecting a block on which to perform an erase operation;
   erasing the selected block;
   receiving test data corresponding to the selected block;
   determining a soft program verify voltage level based on the test data; and
   soft programming the erased selected block using the soft program verify voltage level.

2. The method of claim 1, wherein the determining the soft program verify voltage level comprises selecting the soft program verify voltage level from a plurality of soft program verify voltage levels.

3. The method of claim 1, wherein the determining the soft program verify voltage level comprises:
  determining a soft program reference voltage; and
  generating a soft program verify voltage at the soft program verify voltage level using the soft program reference voltage.

4. The method of claim 1, wherein the soft programming the erased selected block comprises:
  determining that a cell of the erased selected block fails the soft program verify voltage level;
  applying a soft program voltage pulse to the cell; and
  determining whether the cell fails or passes the soft program verify voltage level.

5. The method of claim 4, wherein erasing the selected block comprises:
  applying erase pulses to each cell of the selected block until each cell passes a predetermined erase verify voltage level, wherein the soft program verify voltage level is less than the erase verify voltage level.

6. The method of claim 5, further comprising:
  prior to erasing the selected block, programming each cell of the selected block which fails a predetermined program verify voltage level, wherein the erase verify voltage level is less than the program verify voltage level.

7. The method of claim 1, wherein the test data comprises a program/erase cycle count for the selected block, and wherein the soft program verify voltage level is determined based at least in part on the program/erase cycle count.

8. The method of claim 7, further comprising:
  updating the program/erase cycle count for the selected block; and
  storing the updated program/erase cycle count.

9. The method of claim 7, wherein the test data further comprises a block size for the selected block, and wherein the soft program verify voltage level is determined based at least in part on the program/erase cycle count and the block size.

10. The method of claim 1, wherein the test data indicates an expected number of program/erase cycles to be performed on the selected block, and wherein the soft program verify voltage level is determined based at least in part on the expected number of program/erase cycles to be performed on the selected block.

11. A method for performing an erase operation in a non-volatile memory, comprising:
  selecting a block on which to perform an erase operation;
  erasing the selected block;
  receiving a program/erase cycle count corresponding to the selected block;
  determining a soft program verify voltage level based at least in part on the program/erase cycle count; and
  soft programming the erased selected block using the soft program verify voltage level.

12. The method of claim 11, further comprising:
  increasing the program/erase cycle count; and
  storing the increased program/erase cycle count.

13. The method of claim 12, further comprising performing a second erase operation on the selected block, wherein the performing the second erase operation on the selected block comprises:
  erasing the selected block;
  receiving the increased program/erase cycle count corresponding to the selected block;
  determining a second soft program verify voltage level based at least in part on the increased program/erase cycle count, wherein the second soft program verify voltage level is different from the soft program verify voltage level; and
  soft programming the erased selected block using the second soft program verify voltage level.

14. The method of claim 11, wherein the determining the soft program verify voltage level comprises determining the soft program verify voltage level based at least in part on the program/erase cycle count and a block size of the selected block.

15. The method of claim 11, wherein the soft programming the erased selected block comprises:
  determining that a cell of the erased selected block fails the soft program verify voltage level;
  applying a soft program voltage pulse to the cell; and
  determining whether the cell fails or passes the soft program verify voltage level.

16. The method of claim 15, wherein erasing the selected block comprises:
  applying erase pulses to each cell of the selected block until each cell passes a predetermined erase verify voltage level, wherein the soft program verify voltage level is less than the erase verify voltage level.

17. A non-volatile memory comprising:
  a plurality of blocks;
  a test block, wherein the test block stores test data corresponding to each of the plurality of blocks; and
  a flash control coupled to the plurality of blocks and the test block, the flash control determining a soft program verify voltage level for a particular block of the plurality of blocks based on the test data for the particular block when the particular block is being soft programmed.

18. The non-volatile memory of claim 17, wherein the stored tests data stores a program/erase cycle count for each of the plurality of blocks.

19. The non-volatile memory of claim 17, wherein the stored tests data indicates an expected number of program/erase cycles to be performed on each of the plurality of blocks.

20. The non-volatile memory of claim 17, further comprising:
  a charge pump coupled to the plurality of blocks, the charge pump providing a soft program verify voltage to the particular block at the determined soft program verify voltage level when the particular block is being soft programmed.

* * * * *